(12) United States Patent
Mohacsi et al.

(10) Patent No.: US 12,026,435 B2
(45) Date of Patent: Jul. 2, 2024

(54) BUILDING MODEL USER INTERFACE AND METHOD OF USE

(71) Applicant: GRAPHISOFT SE, Budapest (HU)

(72) Inventors: Peter Mohacsi, Budapest (HU); Gabor Horvath, Budapest (HU)

(73) Assignee: GRAPHISOFT SE, Budapest (HU)

( * ) Notice: Subject to any disclaimer, the term of this patent is extended or adjusted under 35 U.S.C. 154(b) by 0 days.

(21) Appl. No.: 17/473,409

(22) Filed: Sep. 13, 2021

(65) Prior Publication Data

US 2021/0406416 A1     Dec. 30, 2021

Related U.S. Application Data

(63) Continuation of application No. 14/788,552, filed on Jun. 30, 2015, now abandoned.

(60) Provisional application No. 62/023,488, filed on Jul. 11, 2014.

(51) Int. Cl.
| | |
|---|---|
| *G06F 30/13* | (2020.01) |
| *G06F 3/04815* | (2022.01) |
| *G06T 13/80* | (2011.01) |
| *G06T 19/00* | (2011.01) |

(52) U.S. Cl.
CPC .......... *G06F 30/13* (2020.01); *G06F 3/04815* (2013.01); *G06T 13/80* (2013.01); *G06T 19/003* (2013.01); *G06T 2200/24* (2013.01); *G06T 2210/04* (2013.01); *G06T 2219/004* (2013.01)

(58) Field of Classification Search
CPC ..... G06F 30/13; G06F 3/04815; G06T 13/80; G06T 19/003; G06T 2200/24; G06T 2210/04; G06T 2219/004
See application file for complete search history.

(56) References Cited

U.S. PATENT DOCUMENTS

| | | |
|---|---|---|
| 5,109,337 A | 4/1992 | Ferriter et al. |
| 5,307,451 A | 4/1994 | Clark |
| 5,761,674 A | 6/1998 | Ito |
| 5,918,232 A | 6/1999 | Pouschine et al. |

(Continued)

FOREIGN PATENT DOCUMENTS

EP     1 393 255     3/2004

OTHER PUBLICATIONS

"Revit Architecture 2009 User's Guide" (Revit2009 hereafter) Published Apr. 2008 pp. 1-1646.

(Continued)

*Primary Examiner* — Sing-Wai Wu
*Assistant Examiner* — Khoa Vu
(74) *Attorney, Agent, or Firm* — Jackson Walker LLP; Christopher J. Rourk

(57) ABSTRACT

A system for building information modeling comprising a plurality of 2D documentation sets associated with a building. A 3D model associated with the building, the 3D model including a plurality of user-selectable controls, wherein each user-selectable control comprises an icon and an associated balloon that is generated when the icon is selected. The balloon for each user-selectable control comprising a first selection control that causes one of the plurality of 2D documentation sets to be shown after an animation sequence. The balloon for each user-selectable control comprising a second selection control that causes a transition to a 3D model having an overlay of the 2D documentation sets.

19 Claims, 2 Drawing Sheets

(56) References Cited

U.S. PATENT DOCUMENTS

| | | | |
|---|---|---|---|
| 5,930,801 A | 7/1999 | Falkenhainer et al. | |
| 5,995,107 A | 11/1999 | Berteig et al. | |
| 6,037,945 A | 3/2000 | Loveland | |
| 6,063,128 A | 5/2000 | Bentley et al. | |
| 6,442,748 B1 | 8/2002 | Bowman-Amuah | |
| 6,526,406 B1 | 2/2003 | Suzuki et al. | |
| 6,558,606 B1 | 5/2003 | Kulkarni et al. | |
| 6,615,166 B1 | 9/2003 | Guheen et al. | |
| 6,792,205 B2 | 9/2004 | Frisken et al. | |
| 6,797,351 B2 | 9/2004 | Kulkarni et al. | |
| 6,859,768 B1 | 2/2005 | Wakelam et al. | |
| 6,862,024 B2 | 3/2005 | Perry et al. | |
| 6,868,525 B1 | 3/2005 | Szabo | |
| 6,882,892 B2 | 4/2005 | Farrah et al. | |
| 6,982,712 B2 | 1/2006 | Ohto | |
| 7,042,468 B2 | 5/2006 | Schwegler et al. | |
| 7,054,885 B1 | 5/2006 | Hoffman et al. | |
| 7,116,341 B2 | 10/2006 | Ohto | |
| 7,216,003 B2 | 5/2007 | Faulkner et al. | |
| 7,228,316 B2 | 6/2007 | Gutierrez et al. | |
| 7,231,410 B1 | 6/2007 | Walsh et al. | |
| 7,233,885 B1 | 6/2007 | Larabee et al. | |
| 7,324,102 B2 | 1/2008 | Inzinga et al. | |
| 7,340,383 B2 | 3/2008 | Mayuzumi et al. | |
| 7,492,364 B2 | 2/2009 | Devarajan et al. | |
| 7,509,241 B2 | 3/2009 | Guo et al. | |
| 7,551,182 B2 | 6/2009 | Bethune et al. | |
| 7,761,266 B2 | 7/2010 | Mangon et al. | |
| 7,859,544 B2 | 12/2010 | Okada | |
| 7,936,354 B2 | 5/2011 | Temesvari et al. | |
| 8,072,455 B2 | 12/2011 | Temesvari et al. | |
| 8,352,218 B2 | 1/2013 | Balla et al. | |
| 8,436,851 B2 | 5/2013 | Hoffman et al. | |
| 8,818,768 B1 | 8/2014 | Fan | G06F 17/5004 345/419 |
| 9,020,783 B2 | 4/2015 | Narayan et al. | |
| 9,177,085 B2 | 11/2015 | Snyder et al. | |
| 2001/0047251 A1 | 11/2001 | Kemp | |
| 2002/0013704 A1 | 1/2002 | Finney | |
| 2002/0035451 A1 | 3/2002 | Rothermel | |
| 2002/0129001 A1 | 9/2002 | Levkoff et al. | |
| 2002/0194113 A1 | 12/2002 | Lof et al. | |
| 2003/0036888 A1 | 2/2003 | Bentley | |
| 2003/0037182 A1 | 2/2003 | Bentley | |
| 2003/0050871 A1 | 3/2003 | Broughton | |
| 2003/0135401 A1 | 7/2003 | Parr | |
| 2003/0167265 A1 | 9/2003 | Corynen | |
| 2003/0184545 A1 | 10/2003 | Ohto | |
| 2003/0190588 A1 | 10/2003 | Lechner | |
| 2003/0225605 A1 | 12/2003 | Yokota et al. | |
| 2004/0024624 A1 | 2/2004 | Ciscon et al. | |
| 2004/0027344 A1 | 2/2004 | Ohto | |
| 2004/0093559 A1 | 5/2004 | Amaru et al. | |
| 2004/0153824 A1 | 8/2004 | Devarajan et al. | |
| 2004/0205519 A1 | 10/2004 | Chapel et al. | |
| 2004/0230452 A1 | 11/2004 | Abe et al. | |
| 2005/0038636 A1 | 2/2005 | Wakelam et al. | |
| 2005/0108982 A1 | 5/2005 | Formisano | |
| 2005/0172260 A1 | 8/2005 | Eichstaedt et al. | |
| 2005/0188348 A1 | 8/2005 | Han et al. | |
| 2005/0197856 A1 | 9/2005 | Drucker | |
| 2006/0044307 A1* | 3/2006 | Song | G06T 11/206 345/419 |
| 2006/0114252 A1 | 6/2006 | Ramani et al. | |
| 2006/0190312 A1 | 8/2006 | Onuma et al. | |
| 2007/0013690 A1 | 1/2007 | Grimaud et al. | |
| 2007/0174027 A1 | 7/2007 | Moiseyev | |
| 2007/0179759 A1 | 8/2007 | Mangon | |
| 2007/0188500 A1* | 8/2007 | Talmor | G06Q 50/16 345/473 |
| 2007/0204241 A1 | 8/2007 | Glennie et al. | |
| 2007/0285424 A1 | 12/2007 | Cheng et al. | |
| 2007/0288207 A1 | 12/2007 | Backe et al. | |
| 2008/0077364 A1 | 3/2008 | Wakelam et al. | |
| 2008/0140937 A1 | 6/2008 | Nalawade et al. | |
| 2008/0249749 A1 | 10/2008 | Egbertson et al. | |
| 2009/0033656 A1 | 2/2009 | Larkins et al. | |
| 2009/0089291 A1 | 4/2009 | Daily et al. | |
| 2009/0113326 A1 | 4/2009 | Miyamoto et al. | |
| 2011/0010134 A1 | 1/2011 | Balla et al. | |
| 2011/0078169 A1 | 3/2011 | Sit | |
| 2011/0247006 A1 | 10/2011 | Kim et al. | |
| 2011/0270582 A1* | 11/2011 | Davis | G06F 30/00 703/1 |
| 2012/0038638 A1* | 2/2012 | Zhu | G06T 19/00 345/419 |
| 2012/0105449 A1 | 5/2012 | Buchowski et al. | |
| 2012/0190458 A1 | 7/2012 | Gerson et al. | |
| 2012/0310906 A1 | 12/2012 | Miller et al. | |
| 2014/0082557 A1* | 3/2014 | Warner | G06F 3/0482 715/834 |
| 2014/0095122 A1* | 4/2014 | Appleman | G06T 19/003 703/1 |
| 2014/0163931 A1 | 6/2014 | Snyder et al. | |
| 2015/0091906 A1* | 4/2015 | Dishno | G06F 16/9577 345/427 |
| 2015/0278984 A1 | 10/2015 | Koker et al. | |
| 2016/0240011 A1* | 8/2016 | Fedosov | G01C 21/3638 |

OTHER PUBLICATIONS

EP Search Report dated Feb. 17, 2006 for EP05256177 (6 pages).

Non-Final Office Action for U.S. Appl. No. 10/956,902 dated Jan. 10, 2007 (12 pages).

Wang, et al., "4D Dynamic Resource Management for Construction Planning and Resource Utilization", Automation in Construction, vol. 13, Issue 5, pp. 575-589, Sep. 2004, available online—Jun. 1, 2004.

Kam, et al., "The Product Model and Fourth Dimension Project", Itcon, vol. 8, pp. 137-166, 2003.

Kazi, et al., "Management of Best Practices in Construction Through Interfacing with Product Models", obtained from http://cic.vtt.fi/projects/globemen/book/index.html, created Nov. 26, 2002, Presented as "Product Models as an Interface to Best Practice Management in the Construction Industry", eSMART, Nov. 19-21, pp. 1-13.

Kazi, et al. "Distributed Engineering in Construction: Findings fom the IMS Globemen Project", Itcon, vol. 6, 2001, pp. 129-148.

Froese, et al., "Industry Foundation Classes for Project Management—A Trial Implementation", 1999, Itcon, vol. 4, pp. 17-36, http://www.itcon.org/1999/2.

Non-Final Office Action for U.S. Appl. No. 10/956,902 dated Aug. 29, 2007 (23 pages).

Non-Final Office Action for U.S. Appl. No. 10/956,902 dated Apr. 10, 2008 (25 pages).

PCT Search Report and Written Opinion for PCT/US06/37773 dated Feb. 12, 2008 (7 pgs.).

Non-Final Office Action for U.S. Appl. No. 11/375,871 dated May 13, 2008 (11 pages).

Non-Final Office Action for U.S. Appl. No. 11/375,871 dated Nov. 26, 2008 (15 pages).

PCT Search Report and Written Opinion for PCT/US07/06353 dated Sep. 8, 2008 (10 pgs.).

Zhang, et al., "4D Visualization of Construction Site Management", Information Visualization, 2001, Proceedings, Fifth International Conference on Information Visualization, pp. 382-387, posted online: Aug. 7, 2002.

Nyambayo, et al., "External Product Library System—An Implementation Industry Foundation Classes Release 2.0 Library Model", 2003, retrieved from http://www.cs.auckland.ac.nz/~trebor/papers/NHYAM00A.pdf (10 pgs).

Office Action for U.S. Appl. No. 11/235,344 dated Aug. 24, 2007 (23 pages).

Final Office Action for U.S. Appl. No. 11/235,344 dated Jul. 8, 2008 (27 pages).

PCT Search Report and Written Opinion for PCT/US07/17828 dated Nov. 18, 2008 (9 pages).

(56) References Cited

OTHER PUBLICATIONS

Lutz, et al., "Analyzing Linear Construction Operations Using Simulation and Line of Balance", 1993, Transportation Research Board (Abstract), pp. 1-3.
Yang, et al., "Stochastic Resource-Constrained Scheduling for Repetitive Construction Projects with Uncertain Supply of Resources and Funding", available online Apr. 18, 2005, International Journal of Project Management, vol. 23, pp. 546-553.
Kankainen, et al., "A Line-of-Balance Based Schedule Planning and Control System", 2003, 11th International Group for Lean Construction Conference, Virginia Tech, Virginia (12 pages).
Trofin, "Impact of Uncertainty on Construction Project Performance Using Linear Scheduling", 2004, University of Florida, pp. iii-xiii and pp. 1-91.
Yang, et al., "Stochastic Analysis on Project Duration Under the Requirement of Continuous Resource Utilization", Aug. 2002, Proceedings IGLC-10, Brazil, pp. 1-13.
Non-Final Office Action for U.S. Appl. No. 11/502,690 dated Jul. 23, 2009 (14 pages).
McCabe, "Monte Carlo Simulation for Schedule Risks", 2003, Proceedings of the 2003 Winter Simulation Conference, pp. 1561-1565.
Altug, "Risk Management and Post Project Evaluation Processes for Research and Development Projects", 2002, Sabanci University, pp. 1-101.
Ma, et al., "Application of 4D for Dynamic Site Layout and Management of Construction Projects", Automation Construction 14 (2005) pp. 369-381.

\* cited by examiner

BUILDING MODEL USER INTERFACE AND METHOD OF USE

RELATED APPLICATIONS

The present application is a continuation of U.S. patent application Ser. No. 14/788,552 filed Jun. 30, 2015, which claims priority to and benefit of U.S. Provisional Patent Application No. 62/023,488, filed Jul. 11, 2014, which is hereby incorporated by reference for all purposes as if set forth herein in its entirety.

TECHNICAL FIELD

The present disclosure relates generally to building models, and more specifically to a building model user interface that allows a user with no experience in the use of building model software tools to readily interface with a software building model.

BACKGROUND OF THE INVENTION

Software building models are sophisticated software tools that allow a user to generate design data for building models. The design data can be two dimensional data sets, such as a document, or three dimensional, such as a 3D building model.

SUMMARY OF THE INVENTION

A system for building information modeling is provided that includes a plurality of 2D documentation sets associated with a building, such as floor plans and elevation views. A 3D model associated with the building includes user-selectable controls, wherein each user-selectable control is identified by an icon and has an associated balloon that is generated when the icon is selected. The balloon for each user-selectable control allows a user to select one of the 2D documentation sets to be shown, or to transition to a 3D model having an overlay of the 2D documentation sets, so as to allow the floor plan, the elevation view or other suitable 2D data sets to be shown within the 3D model.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views, and in which.

DETAILED DESCRIPTION OF THE INVENTION

Figure 1:
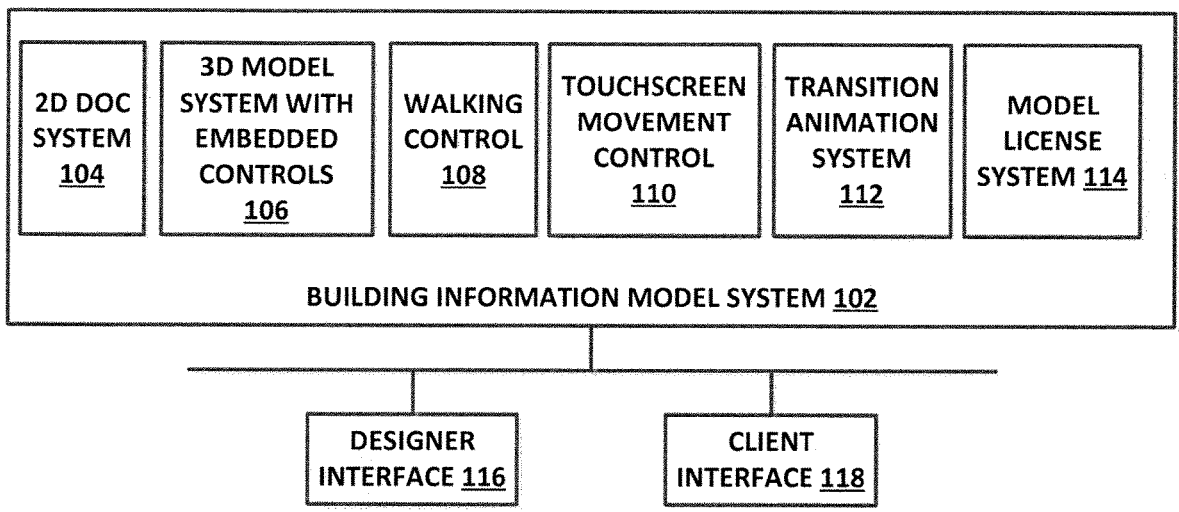
FIG. 1 is a diagram of a system for a building information model system in accordance with an exemplary embodiment of the present disclosure.

In the description that follows, like parts are marked throughout the specification and drawings with the same reference numerals. The drawing figures might not be to scale and certain components can be shown in generalized or schematic form and identified by commercial designations in the interest of clarity and conciseness.

FIG. 1 is a diagram of a system 100 for a building information model system in accordance with an exemplary embodiment of the present disclosure. System 100 can be implemented in hardware or a suitable combination of hardware and software, and can be one or more software systems operating on one or more processors and associated devices, such as hard drives, memory, user interface devices, input/output devices, graphics accelerators, mathematics accelerators, parallel processors and wireless data interfaces.

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications, on one or more processors (where a processor includes a microcomputer or other suitable controller, memory devices, input-output devices, displays, data input devices such as a keyboard or a mouse, peripherals such as printers and speakers, associated drivers, control cards, power sources, network devices, docking station devices, or other suitable devices operating under control of software systems in conjunction with the processor or other devices), or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections.

System 100 includes building information model system 102, 2D documentation set system 104, 3D model system with embedded controls 106, walking control 108, touch-screen movement control 110, transition animation system 112, model license system 114, designer interface 116 and client interface 118. Building information model system 102 allows a user to import or design 2D documentation sets and 3D building models and then to associate the 2D documentation sets and 3D models at predetermined locations within the 3D model, so as to generate user controls that allow a user to readily transition between the 2D documentation sets and 3D models.

2D documentation system 104 provides a plurality of user design tools for generating 2D documentation sets, such as floor plans, elevation plans, section plans and other suitable 2D design and model information, including but not limited to locations and dimensions for walls, floors, doors, windows, stairs, rooms, closets, appliances and other suitable building features. In one exemplary embodiment, the 2D documentation sets and model information can be imported into system 100 from an external application in a predetermined 2D documentation format, such as a portable document format (PDF), an image data format such as a Joint Picture Experts Group (JPEG) format or a Motion Picture Experts Group (MPEG) format, and other suitable formats. In this regard, the 2D documentation set is different from labels or other 2D data that might be inserted within the 3D model, and includes a hyperlink, viewer activation controls and transition controls to allow the 2D documentation set to either be superimposed on the 3D model, to transition from the 3D model to the 2D documentation set or to perform other suitable functions.

3D model system with embedded controls 106 provides a plurality of user design tools for generating 3D design documents or models, such as models of a building having associated building design features including but not limited to walls, floors, doors, windows, stairs, rooms, closets, appliances and other suitable building features. 3D model system with embedded controls 106 also allows the designer to identify locations for embedded user controls within the 3D design models, such as a location at which a 2D documentation sets should be associated with the 3D design document. In one exemplary embodiment, a building design can include multiple floors and associated 2D floor plans for each floor, 2D elevation views of the building from a number of different locations that are outside of the building, 2D section views that show a section of the building from a point internal to the building, and other suitable 2D information, and 3D model system with embedded controls 106 can include one or more user controls that allows a designer to create a hyperlink control for the 2D documentation sets within the 3D building design model. The hyperlink control can include data and controls in addition to the location of the 2D file, such as animation control data to allow 3D models of walls, floors, doors, windows, stairs, rooms, closets, appliances and other suitable building features to be transitioned into and out of the 2D design data in a user interface while the 2D design data remains within in the user interface. In this exemplary embodiment, the combined 2D documentation sets and 3D model will allow a user to execute one or more user controls in a user interface to transition between a 3D model that includes an overlay of selected 2D information or to the 2D documentation sets.

Walking control 108 generates a user interface control that allows a user to simulate walking within a 3D model. In one exemplary embodiment, walking control 108 can be generated within a touch screen interface (TCI) controller that includes a user interface screen generated by an array of picture elements ("pixels") and an associated capacitive element network (or other suitable devices) underneath the user interface screen, where the location of the capacitive elements is correlated with the pixels. An image of a 3D building model can be generated on the user interface screen, where the user can place an icon within the 3D building model by touching a selected point on the TCI controller. The point of contact is then recognized by the TCI controller, such as by using the capacitive circuit elements or in other suitable manners, and that point of contact is correlated with the point within the 3D model that is also being displayed on the user interface screen. An icon is then generated at the point of contact that is associated with a first walking control. The user can then select the icon to cause the first walking control to be activated, after which an animation sequence is generated that shows a transition through the 3D model at a speed that is approximately equal to a slow walking speed. In one exemplary embodiment, the animation sequence transition speed can be determined based on dimension data associated with the 3D model, such as to generate a sequence of images through the 3D model that approximate the changes seen by a user moving at a speed of 1 to 2 miles per hour, or other suitable speeds. In this manner, a user can receive an animation sequence that simulates an actual walk through a building model.

In another exemplary embodiment, walking control 108 can generate an icon that allows a user to interactively control the direction and speed of the walkthrough. Unlike the first exemplary embodiment, where the user places a marker icon within the 3D model and the system then generates an animation sequence as a function of the placement of the marker icon, the second exemplary embodiment generates a user control icon on the user interface that overlays the 3D model, where the user interfaces with the 3D model by interacting with the user control icon. In this exemplary embodiment, the user can cause the animation sequence to simulate moving forwards, backwards, turning right, turning left, moving forward while turning right or left or moving backwards while moving right or left. In addition, the user can be allowed to accelerate the movement using the user control icon.

In either embodiment (marker icon or user control icon), the user can be allowed to or prevented from moving through structural components such as walls and floors. In one exemplary embodiment, the animation sequence can simulate movement through doors, such that if the marker icon is placed in an adjacent room, the animation sequence simulates walking through the nearest doorway to the location of the marker icon. For example, if the 3D model includes a window and a view of an interior room, placement of the marker icon within the interior room and subsequent activation of the animation sequence causes the system to generate a path from the current point of view location within the 3D model to the marker icon that leads through a door, and then generates an animation sequence at a walking pace from the current point of view location to the marker icon location. Alternatively, the user control icon can be used to allow the animation sequence to simulate movement through walls, floors or other suitable solid building model features, or other suitable functions and combinations of functions can also or alternatively be used.

Touchscreen movement control 110 is configured to recognize predetermined user interface actions and to generate model animation control data. As discussed above, a TCI controller can include an array of pixels and an associated array of sensors, and a user interaction with the array of sensors can be used to identify an associated pixel or pixels, such that the location within a 3D model can be determined.

Touchscreen movement control 110 can determine a mode of operation for a display and can generate display animation or transition control data as a function of a user interface action. In one exemplary embodiment, a single point of contact and associated movement on the TCI when the model is in a first mode of operation can be used to rotate a model left or right if the associated movement is horizontal, to rotate the model up or down if the associated movement is horizontal, or to provide a combination of left-right and up-down rotational movement otherwise. Two points of contact and associated simultaneous movement (such as reflecting a contact with two fingers) in the first mode of operation can be used to displace the model left or right if the associated movement is horizontal, to displace the model up or down if the associated movement is horizontal, or to provide a combination of left-right and up-down displacement otherwise. Two points of contact and associated simultaneous movement away from each other (such as reflecting a contact with two fingers and "spreading") in the first mode of operation can be used to zoom in, and movement towards each other (such as reflecting a contact with two fingers and "pinching") can be used to zoom out. Likewise, other suitable functions or modes of operation can also or alternatively be used.

Transition animation system 112 generates transition animation sequences from 2D documentation sets to 3D models with 2D documentation set overlays. In one exemplary embodiment, elements from a 3D model can be associated with points on a 2D documentation set, so as to align the 3D model with the 2D documentation set. Upon receipt of a transition control, such as by selection of a 3D control while a 2D documentation set for a floor plan is being displayed, transition animation system 112 can generate an animation sequence that causes the 3D model to "grow" out of the 2D documentation set for the floor plan, such as to generate a 3D model of walls along the floor plan where walls are shown, to generate a 3D model of doors and windows in the walls where doors and windows are shown in the 2D documentation set for the floor plan, and to generate other suitable animation sequences. In this exemplary embodiment, coordinate locations within the 2D documentation set can be associated with coordinate locations within the 3D model, and an overlay display can be generated that has an associated animation sequence from the 2D documentation set to the 3D model. When the user selects an associated control to transition from a 2D documentation set to a 3D model with a 2D documentation set overlay, an animation sequence can be initiated where the 2D documentation set is rotated out of the 2D plane of the user interface display into a 3D environment and the 3D model for the associated floor plan, elevation, section or other suitable 2D documentation sets can appear to "grow" out of the 2D documentation set, to allow a user to visualize the relationship between the 2D documentation set and the associated 3D model. In one exemplary embodiment, these animation sets can be generated in a frame by frame manner using animation tools or other suitable tools.

Model license system 114 allows a designer to license versions of a combined 2D documentation sets and 3D building models for a specific project. In one exemplary embodiment, a designer can have a single client for a project, and may only require a single license to allow that client to see the combined 2D documentation sets and 3D building models for that project, such that only a single license is needed. Likewise, other projects may include a large number of clients, such as large buildings that are being designed for corporations, where each of the clients may require a license to see the combined 2D documentation sets and 3D building models for that project. Model license system 114 allows a designer to control the number of model licenses, so as to prevent unauthorized users from obtaining access to copies of the combined 2D documentation sets and 3D models.

Designer interface 116 allows a designer to access user controls and tools to download 2D documentation sets and 3D models into system 100, to generate links between 2D documentation sets and 3D models, to generate animation sequences and to perform other suitable functions. In one exemplary embodiment, a user can associate a 2D documentation set with a 3D model and discover that discrepancies between the two models require the user to edit the 2D documentation set or the 3D model. Editing can be performed within design interface 116 or external to designer interface 116. After the composite 2D documentation set and 3D models have been finalized and associated links and animation between the 2D documentation set and 3D models have been provided, the designer can release the combined 2D documentation set and 3D model to predetermined users using designer interface 116. Likewise, the designer can update or modify the combined 2D documentation set and 3D model, and can retire the old model and publish the revised model using designer interface 116.

Client interface 118 is configured to recognize authorized users to allow them to access a predetermined combined 2D documentation set and 3D model, to receive updates and to perform other suitable functions. In one exemplary embodiment, client interface 118 can be an application that is configured to provide model interface functionality as described herein, but which does not allow the user to edit or modify any 2D documentation set or 3D model elements.

In operation, system 100 allows a building designer to combine 2D documentation sets and 3D models and to provide hyperlinks and animation sequences for transitioning between the 2D and 3D models. The combined 2D documentation sets and 3D models and associated hyperlinks, animation sequences and controls can be published and licensed to predetermined users or clients.

Figure 2:
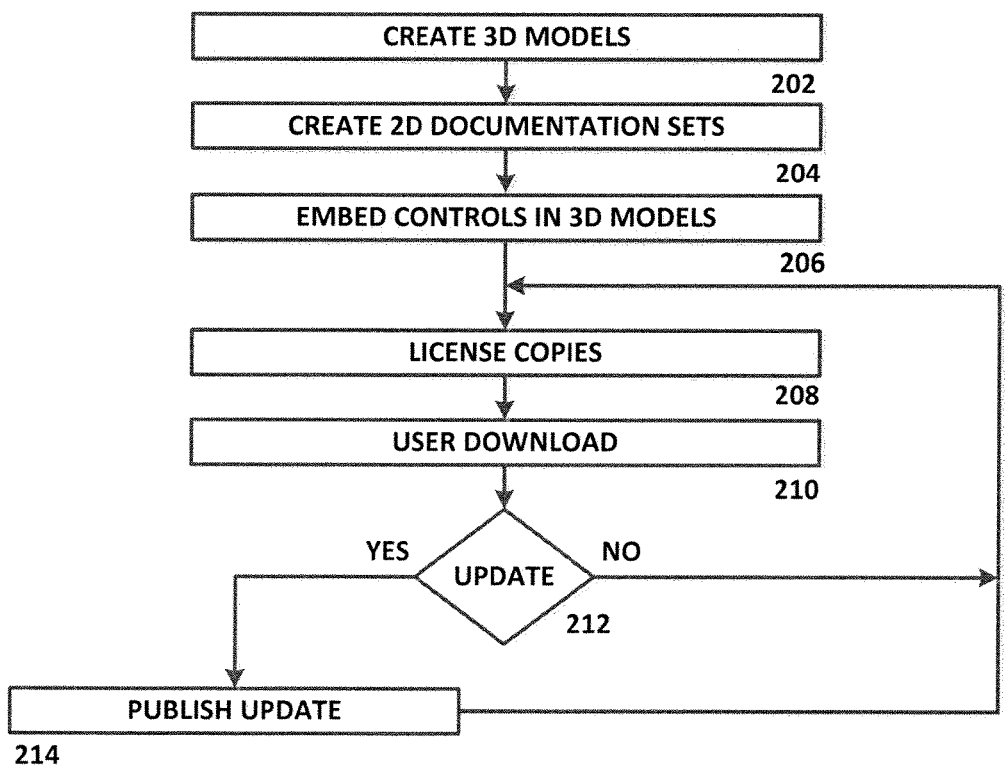
FIG. 2 is a diagram of an algorithm for a building information model system in accordance with an exemplary embodiment of the present disclosure.

FIG. 2 is a diagram of an algorithm 200 for a building information model system in accordance with an exemplary embodiment of the present disclosure. Algorithm 200 can be implemented in hardware or a suitable combination of hardware and software, and can be one or more software systems operating on one or more processors and associated devices such as hard drives, memory, user interface devices, printers, input/output devices, graphics accelerators, mathematics accelerators, parallel processors and wireless data interfaces.

Algorithm 200 begins at 202, where one or more 3D models are created. In one exemplary embodiment, a 3D model software application operating on a processor can be used to generate a building model having floors, walls, doors, windows, stairs and other suitable 3D building design model elements, such as using a Building Information Modeling (BIM) program such as ArchiCAD® available from Graphisoft of Budapest, Hungary. The 3D model can be imported into a work environment for a combined 2D documentation sets and 3D model system, such as by storing the 3D file in a directory of a memory organization structure, the combined 2D documentation sets and 3D model system can include 3D model editing and designing tools, or other suitable configurations can also or alternatively be provided. The algorithm then proceeds to 204.

At 204, one or more 2D documentation sets are created based on the 3D model. In one exemplary embodiment, a 2D documentation set software application operating on a processor can be used to generate floor plans, elevation plans, section plans and other suitable 2D building design documentation sets, such as to output a PDF file, a JPEG file, an MPEG file or other suitable files. The 2D documentation set files can be imported into a work environment for a combined 2D documentation sets and 3D model system, such as by storing the 2D file in a directory of a memory organization structure or in other suitable manners. The algorithm then proceeds to 204.

At 204, controls are embedded in the 3D models to link locations within the 3D model to the 2D documentation sets. In one exemplary embodiment, the controls can include one or more user-selectable controls to allow a user to transition between the 2D documentation sets and the 3D models, to allow the user to generate an overlay of a 2D documentation set at a predetermined location within the 3D model, to generate an animation sequence that transforms between the 2D documentation sets and the 3D model (so as to allow users to readily visualize the relationship between the 2D documentation sets and the 3D models), or to provide other suitable controls. The algorithm then proceeds to 208.

At 208, a designer selects a number of licenses of the combined 2D documentation sets and 3D model to be provided to one or more clients. In one exemplary embodiment, the designer can provide identifying data to allow each of the clients to be specifically identified, such as by entering an email address for a unique key to be emailed to or in other suitable manners. The algorithm then proceeds to 210.

At 210, the user or client downloads the combined 2D documentation sets and 3D model. In one exemplary embodiment, the user can select a control such as a hyperlink and can be prompted to enter identifying information, to create an account or to otherwise uniquely identify the user. The user can then be permitted to download the combined 2D documentation sets and 3D model, an associated viewer and other suitable data and software that operates on a processor to allow the user to interface with the combined 2D documentation sets and 3D model. The algorithm then proceeds to 212.

At 212, it is determined whether an update is available for the combined 2D and 3D model. If no update is available, the algorithm returns to 208, otherwise the algorithm proceeds to 214 where the update is published. In one exemplary embodiment, the update can be published by posting a link to a file containing the update on a website, by transmitting a message to a predetermined address to notify the user that the update is available, or in other suitable manners. The algorithm then returns to 208.

In operation, algorithm 200 allows a designer to combine 2D documentation sets and 3D models and to generate user controls to allow a user such as a client to navigate between the 2D documentation sets and 3D models, using animation and other associated data to allow an unskilled user to more readily understand the association between the 2D and the 3D models.

Figure 3:
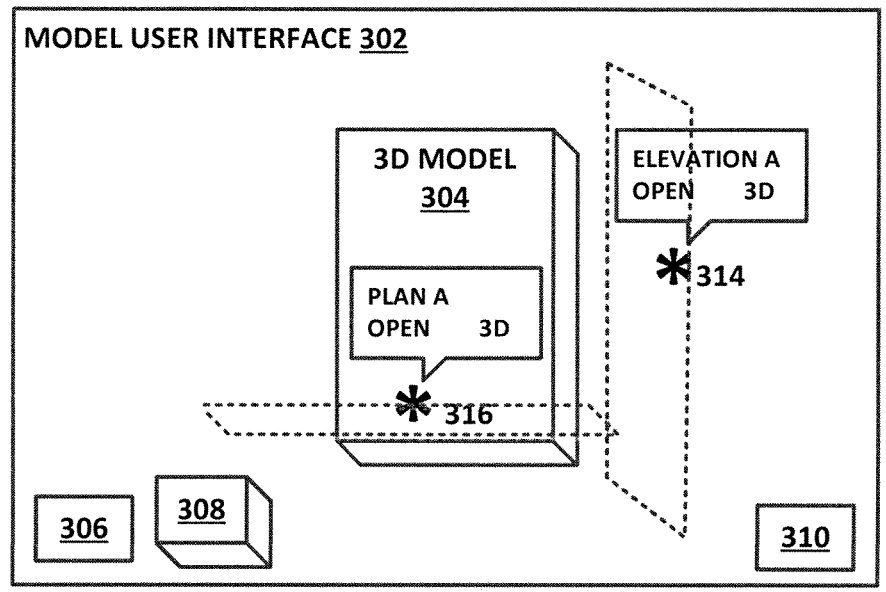
FIG. 3 is a diagram of a user interface for interacting with a combined 2D and 3D model, in accordance with an exemplary embodiment of the present disclosure.

FIG. 3 is a diagram of a user interface 300 for interacting with a combined 2D documentation sets and 3D model, in accordance with an exemplary embodiment of the present disclosure. User interface 300 can be implemented using one or more software systems operating on one or more processors and associated devices.

User interface 300 includes model user interface 302, which includes an associated 3D model 304. 3D model 304 can be generated using convention 3D modelling techniques to create the appearance of a 3D object within the 2D display of model user interface 302. In addition, user interface 300 includes PLAN A control and ELEVATION A control, each of which allow a user to select to open the 2D documentation set associated with the control in a 2D display, or to generate the associated 2D documentation set in a 3D display with 3D model 304. For example, dashed lines associated with PLAN A control and ELEVATION A control approximate the location of the associated 2D plan and 2D elevation that would be generated if the associated PLAN A control or ELEVATION A control was generated in 3D. Likewise, if the associated plan or elevation model was simply opened, then they could be generated in user interface 300, either with or without an animation sequence showing how the associated 2D plan or elevation relate to 3D model 304. In one exemplary embodiment, PLAN A control and ELEVATION A control are shown in the 3D model as a symbol (* in this exemplary embodiment), without the associated balloon, which can be generated when a user moves a cursor over the symbol, when a user touches the symbol in a touch screen interface or in other suitable manners.

User interface 300 includes 2D control 306, 3D control 308 and walk control 310. In one exemplary embodiment, a user can select 2D control 306 or 3D control 308 to transition back to a base 2D or 3D view, such as to switch between 2D and 3D views, to return to a base 2D or 3D view after zooming in or out, or in other suitable manners. Walk control 310 allows a user to select a walk mode of display and one or more associated controls, such as to allow the user to place an at a predetermined location within icon 3D model 304 and to generate an animation sequence at walking speed, so as to simulate the way it would appear to the user to walk through the model. Alternatively, an interactive walk control can be provided, as described below.

In operation, user interface 300 provides a small number of simple controls to allow a user to interact with a combined 2D and 3D building model, so as to switch between 2D documentation set and 3D models using embedded user controls, to generate an animation sequence that simulates a walk through the 3D model and for other suitable purposes.

Figure 4:
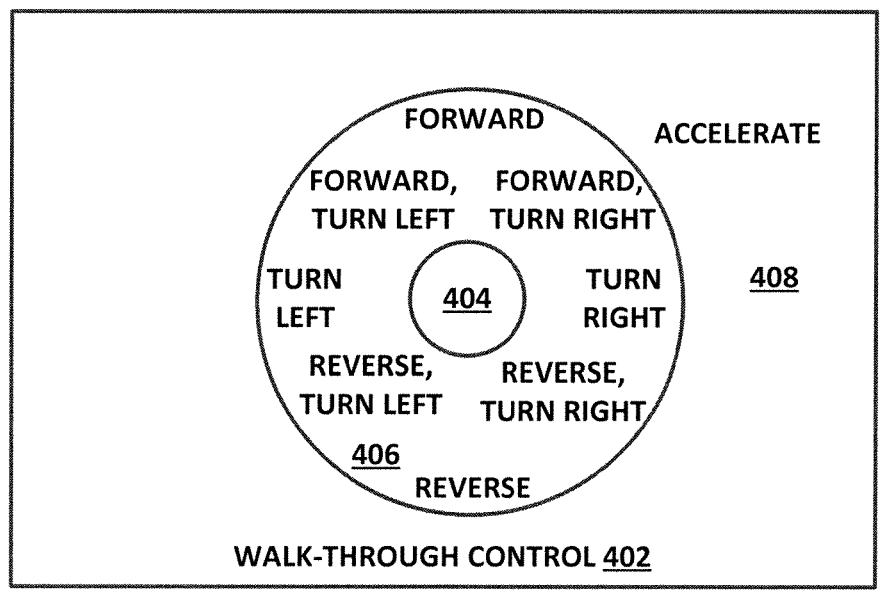
FIG. 4 is a diagram of a user interface for interacting with a 3D model, in accordance with an exemplary embodiment of the present disclosure.

FIG. 4 is a diagram of a user interface 400 for interacting with a 3D model, in accordance with an exemplary embodiment of the present disclosure. User interface 400 can be implemented using one or more software systems operating on one or more processors and associated devices.

User interface 400 includes walk-through control 402, which can be generated at a predetermined location within user interface 400, can be relocated to a user selected position or which can be otherwise generated. Walk-through control 402 includes center 404 and perimeter 406. A user activates walk-through control 402 by placing their finger, a stylus or other suitable device inside center 404 and then moving center 404 within perimeter 406. In one exemplary embodiment, moving center 404 upwards results in forward movement, whereas moving center 404 downwards results in reverse movement. Moving center 404 left or right results in turning in that direction, and moving center 404 diagonally results in forward or reverse turns in the associated left or right direction. In addition, moving center 404 into the accelerate region 408 results in accelerated movement in the associated direction.

In one exemplary embodiment, activation of walk-through control 402 causes the display to relocate to an approximate eye-level location of one floor of an associated 3D model. In this exemplary embodiment, if a user has selected a point of view outside and above the building that is being modeled and then activates walk-through control 402, the point of view shown in user interface 400 can be moved to the ground level. If a user has selected a point of view inside of the building that is being modeled at a selected level and then activates walk-through control 402 from a point of view that is above or below eye level, the point of view shown in user interface 400 can be moved to eye level at the selected level. Movement of center 404 within walk-through control 402 then results in generation of an animation sequence showing movement through the 3D model at a speed that approximates walking, or running if the center 404 is moved into the accelerate 408 region of user interface 400.

In operation, user interface 400 allows a user to easily navigate through a 3D model, so as to allow the user to interact with embedded controls and to activate transition sequences to 2D documentation set. In this manner, a user can more readily understand the interaction between 2D documentation set such as plan views, elevation views and section views, and a 3D model.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A system for building information modeling comprising:
   a three-dimensional (3D) building model system operating on a processor having associated memory devices and data storage, wherein the data storage stores a plurality of code instructions that configure the processor to generate a 3D building model of a single physical building project having multiple licensees, the 3D building model of the single physical building project comprising:
   at least one stairway element between at least two separate floor structural components, wherein the floor structural components are disposed vertically adjacent to each other;
   a plurality of 3D room features on each of the floor structural components, where each 3D room feature has a plurality of associated separate wall structural components, the separate floor structural component, one or more door elements, one or more window elements and one or more closet elements;
   wherein the separate wall structural components and separate floor structural components are continuous between the plurality of 3D room features with in the single physical building project;
   wherein the 3D building model includes a plurality of embedded functional processor controls, each functional processor control configured to generate a user interface command that allows a user to select a function to generate a two dimensional (2D) floor plan, a 2D section view at a point of the embedded control and a hyperlink to an animation sequence starting at the point of the embedded control;
   wherein the embedded functional processor controls of the 3D building model cause the 2D floor plan and the 2D section view generated in response to the user selection are linked to one or more location in the 3D building model to allow the user to select a transition control within the 3D building model to transition between a 2D documentation sets and the 3D building model, to allow the user to generate an overlay of the 2D documentation sets at a predetermined location within the 3D building model, and to generate the animation sequence to transforms between the 2D documentation sets and the 3D building model in a sequence that creates a temporal relationship between the 2D documentation sets and the 3D building model;
   wherein each user-selectable control comprises an icon and an associated balloon that is generated by the processor when the icon is user-selected;
   the balloon for each user-selectable control comprising a first selection control that causes the processor to generate the animation sequence that ends with one of the plurality of 2D documentation sets; and
   the balloon for each user-selectable control comprising a second selection control that causes the processor to generate the animation sequence that ends with a view of the 3D building model having an overlay of one of the 2D documentation sets.

2. The system of claim 1 further comprising a 2D documentation set editing system operating on the processor that is configured to generate one or more user controls to allow a user to edit one of the plurality of 2D documentation sets while modifying an associated user-selectable control for the edited 2D documentation set in the 3D building model in response to the user edit to the 2D documentation set.

3. The system of claim 1 further comprising a 3D building model edit system with embedded controls operating on the processor that is configured to generate one or more user controls to allow a user to edit the 3D building model while maintaining the plurality of associated user-selectable controls in the 3D building model and adding a new associated user-selectable control in an associated 2D documentation set as a function of the user edit.

4. The system of claim 1 further comprising a walking control that receives a user-entered location within the 3D building model and that causes the processor to generate an animation sequence that simulates walking through the 3D building model from a starting location in one of the 2D documentation sets to the user-entered location without additional user input during the animation sequence.

5. The system of claim 1 further comprising a touchscreen movement control that generates a user control and receives a user-entered input and that causes the processor to generate an animation sequence that simulates walking through the 3D building model from a starting location as a function of the user-entered input.

6. The system of claim 5 wherein the touchscreen movement control further comprises:
   a first persistent circle icon disposed away from a border of the user interface associated with a rest state; and
   a second persistent circle icon encircling the first circle icon associated with a plurality of first movement states and a continuous transition between states, wherein the first persistent circle icon and the second persistent circle icon are persistent in each state and are not created in response to an interaction with the first circle icon.

7. The system of claim 6 wherein the touchscreen movement control further comprises a third persistent area outside of the second persistent circle icon associated with a plurality of second movement states including an acceleration state.

8. The system of claim 1 further comprising a transition animation sequence system operating on the processor and configured to generate one or more user controls to allow a user to generate an animation transition from one of the 2D documentation data sets to the 3D building model.

9. The system of claim 1 further comprising a model license system operating on the processor and configured to transmit the plurality of 2D documentation sets and the 3D building model in a format compatible with a viewer system to a predetermined licensed processor that has a pre-existing key that is associated with the plurality of 2D documentation sets and the 3D building model and that has been transmitted by a designer to the user to allow the user to access the plurality of 2D documentation sets and the 3D building model.

10. A method for building information modelling comprising:
- generating a three dimensional (3D) building model associated with the building project having multiple licensees using a processor, the 3D building model including a plurality of user-selectable functional controls operating on the processor, wherein each user-selectable functional control comprises an icon and an associated balloon that is generated by the processor when the icon is user-selected, the icon associated with a specific physical location with the 3D building model;
- generating a plurality of 2D documentation sets associated with a building using a processor when a user selects the user-selectable control:
- generating a first selection control for the balloon for each user-selectable control of the specific physical location of the 3D building model that causes the processor to generate an animation sequence that ends with one of the plurality of 2D documentation sets starting at the specific physical location in the 3D building model; and
- generating a second selection control for the balloon for each user-selectable control that causes the processor to generate an animation sequence that ends with a view of the specific physical location of the 3D building model having an overlay of one of the 2D documentation sets.

11. The method of claim 10 further comprising generating one or more user controls to allow a user to edit one of the plurality of 2D documentation sets using the processor while maintaining an associated user-selectable control for the edited 2D documentation set in the 3D building model, and wherein the 3D building model is a separate data set from each of the plurality of 2D documentation sets and the edits to the 2D documentation are updated in the 3D building model.

12. The method of claim 10 further comprising generating one or more user controls to allow a user to separately edit the 3D building model while maintaining the plurality of associated user-selectable controls in the 3D building model that are associated with one or more of the plurality of 2D documentation sets.

13. The method of claim 10 further comprising receiving a user-entered location within the 3D building model and generating an animation sequence that simulates walking through the 3D building model from a starting location in a separate one of the plurality of 2D documentation sets to the user-entered location.

14. The method of claim 10 further comprising receiving a user-entered input from a user control generated from within a separate one of the plurality of 2D documentation sets and generating an animation sequence that simulates walking through the 3D building model from a starting location as a function of the user-entered input.

15. The method of claim 14 further comprising:
- generating a first persistent circle icon associated with a rest state, wherein the first persistent circle icon is not located at a border of a user interface; and
- generating a second persistent circle icon encircling the first circle icon associated with a plurality of first movement states.

16. The method of claim 15 further comprising designating a third area outside of the second circle icon associated with a plurality of second movement states.

17. The method of claim 10 further comprising generating one or more user controls to allow a user to cause an animation transition to be generated from one of the plurality of 2D documentation data sets that is separate from the 3D model and the other of the plurality of 2D documentation sets to the 3D model.

18. The method of claim 10 further comprising separately transmitting the plurality of 2D documentation sets from the 3D model in a format compatible with a viewer system to a predetermined licensed processor.

19. A system for building information modeling comprising:
- a plurality of separate 2D documentation sets associated with a building project having multiple licensees:
- a 3D model system associated with the building project that is separate from each of the plurality of 2D documentation sets and associated with each of the plurality of 2D documentation sets at a common point in a 3D model and an associated 2D documentation set, the 3D model including a plurality of user-selectable controls operating on a processor, wherein each user-selectable control comprises an icon and an associated balloon that is generated by the processor when the icon is user-selected;
- the balloon for each user-selectable control comprising a first selection control that causes the processor to generate an animation sequence that begins from a rest state in a 3D model and ends with one of the plurality of 2D documentation sets;
- the balloon for each user-selectable control comprising a second selection control that causes the processor to generate an animation sequence begins from a rest state in one of the 2D documentation sets and that ends with a view of the 3D model having an overlay of one of the 2D documentation sets; and
- a model license system operating on the processor and configured to transmit the plurality of 2D documentation sets and the 3D model in a format compatible with a viewer system to a predetermined licensed processor that is authorized to receive the plurality of 2D documentation sets and the 3D model if it is determined that the predetermined licensed processor has a previously-transmitted key that was previously transmitted by an operator of the 3D model system.

* * * * *